United States Patent [19]
Davis et al.

[11] Patent Number: 5,434,800
[45] Date of Patent: Jul. 18, 1995

[54] PROGRAMMABLE SYSTEM FOR THE SYNCHRONIZATION OF AN ELECTRONIC ANGULAR POSITION INDICATOR

[75] Inventors: Richard D. Davis; Jeff Kotowski, both of Nevada City, Calif.

[73] Assignee: Silicon Systems, Inc., Tustin, Calif.

[21] Appl. No.: 287,065

[22] Filed: Aug. 8, 1994

Related U.S. Application Data

[63] Continuation of Ser. No. 938,289, Aug. 31, 1992, abandoned.

[51] Int. Cl.$^6$ .............................................. G01B 7/14
[52] U.S. Cl. ................................ 364/550; 364/486; 364/426.01; 364/431.04; 364/431.1; 324/207.25; 324/172
[58] Field of Search ............... 364/550, 569, 486, 565, 364/424.1, 426.01, 426.04, 431.04, 431.07, 431.1; 377/3, 17; 123/414, 418, 428, 416, 419, 422; 324/207.25, 207.24, 166, 167, 172, 176–178, 225; 310/68 B; 318/700, 254, 430, 431

[56] References Cited

U.S. PATENT DOCUMENTS

| | | | |
|---|---|---|---|
| 4,494,509 | 1/1985 | Long | 123/416 |
| 4,638,498 | 1/1987 | Sinniger et al. | 123/416 |
| 4,814,704 | 3/1989 | Zerrien, Jr. et al. | 324/225 |
| 4,887,215 | 12/1989 | Kumagai et al. | 364/431.04 |
| 4,931,940 | 6/1990 | Ogawa et al. | 364/431.04 |
| 5,041,979 | 8/1991 | Hirka et al. | 364/431.04 |
| 5,105,783 | 4/1992 | Nussbaum et al. | 364/431.04 |
| 5,170,416 | 12/1992 | Goetz et al. | 377/17 |
| 5,264,789 | 11/1993 | Braun et al. | 364/565 |
| 5,317,614 | 5/1994 | Davis et al. | 377/17 |

FOREIGN PATENT DOCUMENTS

0415603  3/1991  European Pat. Off. ............ 364/486

Primary Examiner—Emanuel T. Voeltz
Assistant Examiner—Hal D. Wachsman
Attorney, Agent, or Firm—Hecker & Harriman

[57] ABSTRACT

A programmable system synchronizes the operation of an electronic angular position indicator with the angular displacement of a rotor. The system can synchronize operation with rotors with non-uniform mark spacing. A sensor provides the system with electronic pulse patterns corresponding to marks on the rotor. Pulse patterns are compared to patterns stored in memory to determine the instantaneous angular position of the rotor. The synchronization system provides the angular position indicator with parameters appropriate to the angular position of the rotor. The system obtains synchronization during initial rotations of the rotor and continually checks synchronization during subsequent rotation.

11 Claims, 7 Drawing Sheets

PROGRAMMABLE SYSTEM FOR THE SYNCHRONIZATION OF AN ELECTRONIC ANGULAR POSITION INDICATOR

This is a continuation of application Ser. No. 938,289 filed Aug. 31, 1992, now abandoned.

BACKGROUND OF THE INVENTION

1. Field of the Invention

The present invention relates to the field of synchronizing angular position indicators.

2. Background Art

Many applications require precise information regarding the angular position of a rotating shaft. For example, in automotive applications, engine operations are synchronized with the angular position of the cam shaft or crank shaft. In an internal combustion engine, certain engine operations, such as the firing of spark plugs, the opening and closing of engine valves, injection of fuel, etc., are controlled to maximize fuel efficiency, minimize exhaust emissions, and increase engine performance. This control is provided by synchronizing these operations with the angular position of a rotating crankshaft and/or camshaft.

Many methods are utilized to translate the rotation of a shaft into electrical signals. In one application a marked rotor, formed as a portion of a shaft or mechanically coupled to a shaft, rotates as the shaft rotates. A sensor, positioned near the spinning rotor, produces an electronic pulse signal each time a mark on the rotor passes through its sensing field. By counting pulses in the sensor's output waveform, the angular displacement of the rotor is determined at a resolution inversely proportional to the interval between marks.

Because of practical limitations on the construction of a rotor and the sensitivity of sensors, only a finite number of marks may be positioned on the rotor. This limitation limits the resolution of angular displacement measurements. For example, in some prior art applications, angular displacement can only be determined in 10° increments.

Many applications require angular displacement information at resolutions finer than those attainable by simply detecting the passage of marks on a spinning rotor. Some prior art angular position indicators interpolate between pulses in the sensor output waveform. These prior art schemes estimate future pulse intervals based upon past measured pulse intervals. By dividing the interval between sensor pulses into finer partitions, the resolution of angular displacement information is increased. The resulting waveform, comprised of sensor pulses and interpolated pulses, corresponds to angular positions between marks on a rotor with uniform mark spacing. The interpolated pulses are utilized to trigger events.

Figure 5:
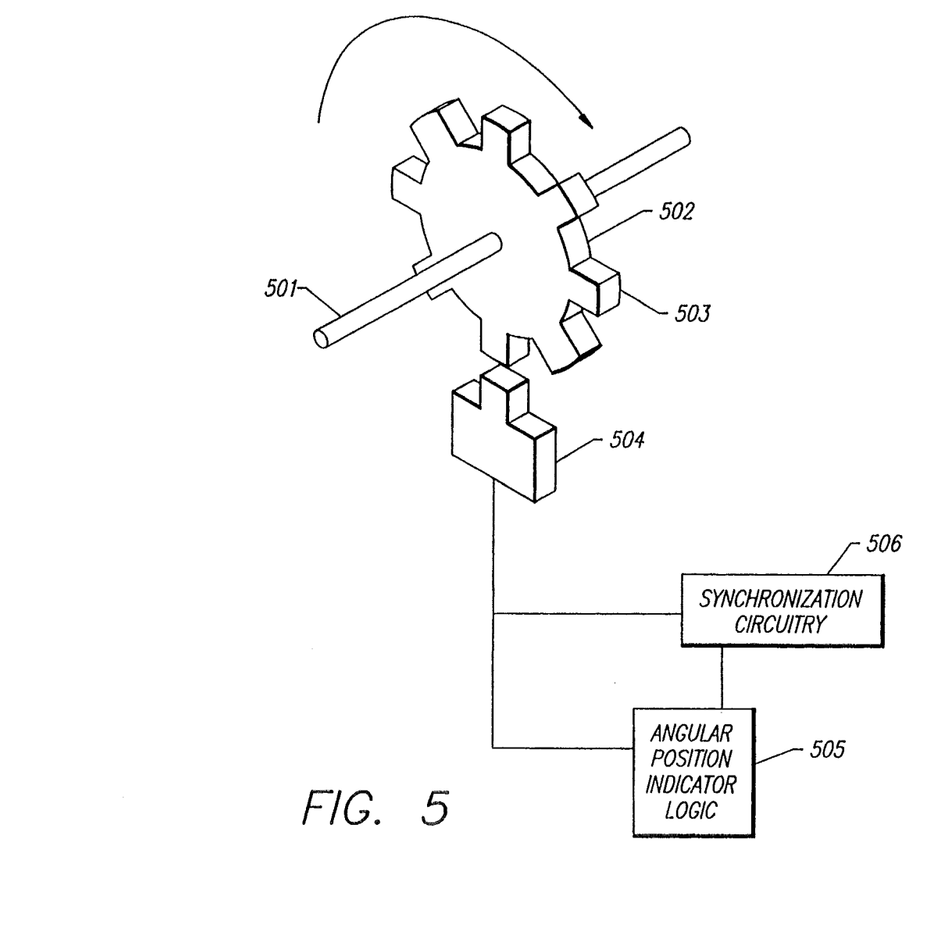
FIG. 5 illustrates a typical application of the prior art.

FIG. 5 illustrates an angular position indicating system utilizing a rotor with uniform mark spacing. A rotating shaft 501 is coupled to a rotor 502. The rotor 502 has eight uniformly-spaced marks (teeth) 503 on its perimeter. The sensor 504 is coupled to angular position indicator logic 505 and synchronization circuitry 506. Angular position indicator logic 505 is also coupled to synchronization circuitry 506.

As each of the teeth 503 passes through a specified region, it is detected by a sensor 504. The sensor 504 outputs a pulse signal each time it detects a tooth. The angular position indicator logic 505 receives the pulse signal from the sensor 504 and interpolates pulses between the sensor pulses to produce angular displacement information with increased resolution. The synchronization circuitry 506 monitors the output of the sensor 504 to verify that particular angular positions on the rotor correspond to particular pulses in the sensor output waveform. The angular position indicator logic 505 uses the output of the synchronization circuitry 506 to maintain synchronization with the rotating rotor.

The synchronization circuitry 506 monitors the output of sensor 504 to verify that particular angular positions on the rotor correspond to particular pulses in the sensor output waveform. The synchronization circuitry 506 sends signals, corresponding to the angular position of the rotor, to the angular position indicator logic 505. The angular position indicator logic 505 uses these signals to coordinate its operations. The angular position indicator logic 505 compares the synchronization signals with its own internal state and adjusts itself if necessary. The angular position indicator logic 505 produces control signals appropriate for subsequent angular positions in synchronization with the angular displacement of the rotor.

To accurately interpolate the rotor's angular displacement, the angular position indicator logic 505 must maintain synchronization with the rotating rotor. When an engine is started, the cam and crank shafts have unknown angular positions. Synchronization circuitry is used to determine the angular position of the rotor. In order to minimize battery drain and exhaust emissions, it is desirable to obtain synchronization after only minimal rotation of the rotor. Synchronization between the angular position indicator logic and the rotor is continually checked during normal rotation of the rotor to insure efficient operation of the engine.

A prior art system utilizes a microprocessor system to synchronize the activities of the angular position indicator with the rotation of a rotor. The microprocessor is programmed with complicated, application-specific software. The microprocessor system utilizes numerous signal connections to obtain sensory information and to output control signals. The size and complexity of the microprocessor system increases as the number of engine control signals required to interface with the microprocessor increases.

The microprocessor system utilizes software-controlled timers to recognize unique sensor pulse patterns, corresponding to unique patterns of teeth on the rotor. A library of unique rotor teeth patterns is pre-programmed into software. Once a sensor pulse pattern is matched with a stored pattern, a synchronization point is identified. The synchronization point is used to calculate synchronization signals for the angular position indicator. The calculation of synchronization signals adds to the processing burden on the microprocessor.

The microprocessor system is inherently limited by the speed of its clock. The microprocessor and its software rely upon the constant frequency provided by the microprocessor's clock to coordinate both internal and external time-sensitive activities. As the angular velocity of the shaft increases, the real-time processing burden on a software-based system increases. A microprocessor system, responsible for many engine functions, has less time to perform other functions as it responds to the increasing real-time burden of tracking the angular displacement of one or more rotors. Some prior art systems, unable to bear the processing burden, severely abbreviate or even discontinue entirely certain processing functions when the rotor achieves high velocity. Functionality provided by the microprocessor is sacrificed to accommodate the burden of maintaining synchronization with one or more rotating shafts.

Microprocessor systems require complex software to prioritize and coordinate processor functions under the constraint of limited clock speed. Customized software is developed for each application. Software implementation requires a substantial engineering investment in research, design, testing, and software maintenance. Designing software suited to the synchronization of an angular position indicator necessitates detailed knowledge of the specific hardware application and of other software running in the microprocessor.

Other prior art systems utilize hardware-based systems to synchronize the activities of angular position indicator logic with the rotation of a rotor. The prior art is not programmable and therefore customized hardware must be developed for each application. Also, the prior art synchronization circuitry is incompatible with rotors with non-uniform mark spacing.

One prior art scheme described in Long, et al., U.S. Pat. No. 4,494,509, utilizes an analog phase locked loop to estimate shaft angular velocity and interpolate shaft angular position. The phase locked loop of Long et al. is incompatible with a rotor with non-uniform mark spacing. Long, et al. does not teach, disclose, or suggest the synchronization of an angular position indicator with a rotor with non-uniform mark spacing.

Hirka et al., U.S. Pat. No. 5,041,979, describes an angular position counter which poorly estimates the angular displacement of a rotor with non-uniform mark spacing. Hirka et al. utilizes a rotor with uniform tooth spacing missing a single tooth. Synchronization circuitry detects the missing tooth and utilizes it as a synchronization point for the angular position indicator. A rotor with non-uniform tooth spacing may have many large intervals between teeth that Hirka et al. would recognize as a missing tooth. Thus, Hirka et al. is incompatible with a rotor with non-uniform mark spacing. Hirka et al. does not teach, disclose, or suggest the synchronization of an angular position indicator with a rotor with non-uniform mark spacing.

SUMMARY

A programmable system synchronizes the operation of an electronic angular position indicator with the angular displacement of a rotor. The system monitors a plurality of sensory inputs to determine the angular displacement of the rotor. Rotation by the rotor, through particular angular positions, produces unique combinations of sensory input.

At least one sensor provides the system with electronic pulse patterns corresponding to marks on the rotor. The rotor may or may not have uniform mark spacing. The system compares pulse patterns produced by a sensor with patterns stored in memory. Each stored pattern is accompanied by data defining the pattern's angular position on the rotor. Thus, once a pattern of rotor marks is recognized, the angular position of the rotor is established.

The synchronization system provides an angular position indicator with operating parameters appropriate to the angular displacement of the rotor. Each stored pattern is accompanied by operating parameters for the angular position indicator. These operating parameters enable an angular position indicator to synchronize its activities with the established angular displacement of the rotor. The system obtains synchronization during initial rotations of the rotor and continually checks synchronization during subsequent rotation. If a pattern of marks is not identified or synchronization with the rotor is lost, the system produces signals indicating the loss of synchronization.

DETAILED DESCRIPTION OF THE INVENTION

A programmable system for the synchronization of an electronic angular position indicator is described. In the following description, numerous specific details are described in order to provide a more thorough description of the present invention. It will be apparent, however, to one skilled in the art, that the present invention may be practiced without these specific details. In other instances, well known features have not been described in detail so as not to obscure the invention.

The programmable hardware system of the present invention synchronizes the operation of an electronic angular position indicator with the angular displacement of a rotor. The rotor may or may not have uniform mark spacing. The system is pre-programmed with patterns corresponding to patterns of marks on the rotor. At least one sensor detects the passage of rotor marks through its sensing field, providing the synchronization system with electronic pulse patterns corresponding to the patterns of marks. The sensor pulse patterns are compared to patterns stored in memory to determine the angular displacement of the rotor. The synchronization system provides the angular position indicator with operating parameters corresponding to the particular pulse pattern matched. These parameters enable the angular position indicator to synchronize its activities.

The system obtains synchronization during initial cycles of the rotor and continues to check synchronization during subsequent rotation. The system maintains performance levels as the angular velocity of the rotor increases. Implementation of this invention unburdens engine processing systems from the time-intensive process of tracking engine shaft angular displacement.

Figure 1:
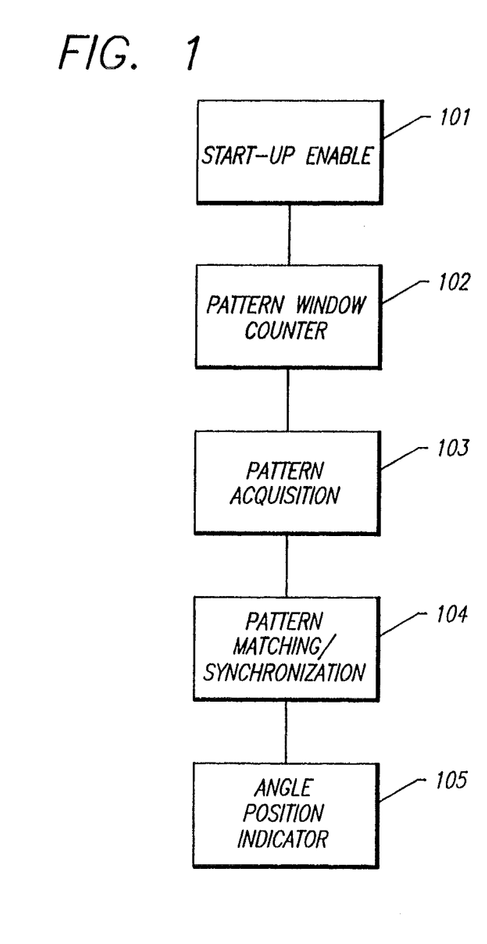
FIG. 1 is a flow-chart of the present invention.

In FIG. 1, a flow-chart of the operation of the present invention is illustrated. Start-up enable circuitry 101 is coupled to pattern window counter circuitry 102. Pattern window counter circuitry 102 is coupled to pattern acquisition circuitry 103. Pattern acquisition circuitry 103 is coupled to pattern matching synchronization circuitry 104. Pattern matching synchronization circuitry 104 is coupled to the angle position indicator 105.

The start-up enable circuitry 101 initializes operation of the system. The pattern window counter circuitry 102 partitions the sensor pulse waveform into pulse patterns. The pattern acquisition circuitry 103 acquires a complete pulse pattern. The pattern matching synchronization circuitry 104 matches the acquired pulse pattern with pre-stored patterns and outputs appropriate operational parameter values and synchronization signals. These values and signals are suited for use by the angular position indicator 105.

In operation, the start-up enable circuitry 101 detects power up and waits for a valid "start of pattern" (SOP) signal. A SOP signal marks the beginning of a pulse pattern. Once a valid SOP signal is received, the start-up enable circuit 101 outputs a synchronization signal. The pattern window counter 102 circuitry counts a pre-programmed number of pulses before outputting an "end of pattern" (EOP) signal. Thus, signals denoting the start and end of a valid pattern are produced.

The pattern acquisition circuitry 103, responsive to the SOP and EOP signals, stores the acquired sensor pulse pattern in a register. The pattern matching synchronization circuitry 104 compares the acquired pattern to a memory bank of pre-programmed pulse patterns. A match between the acquired pattern and a pre-programmed pattern accesses the corresponding memory locations. The memory locations contain operating parameters for an angular position indicator. Synchronization signals are produced by comparing and combining values in accessed memory locations with sensor signals and intermediate signals produced by the present invention. The synchronization signals are provided as outputs suitable for use by the angle position indicator 105.

Figure 2:
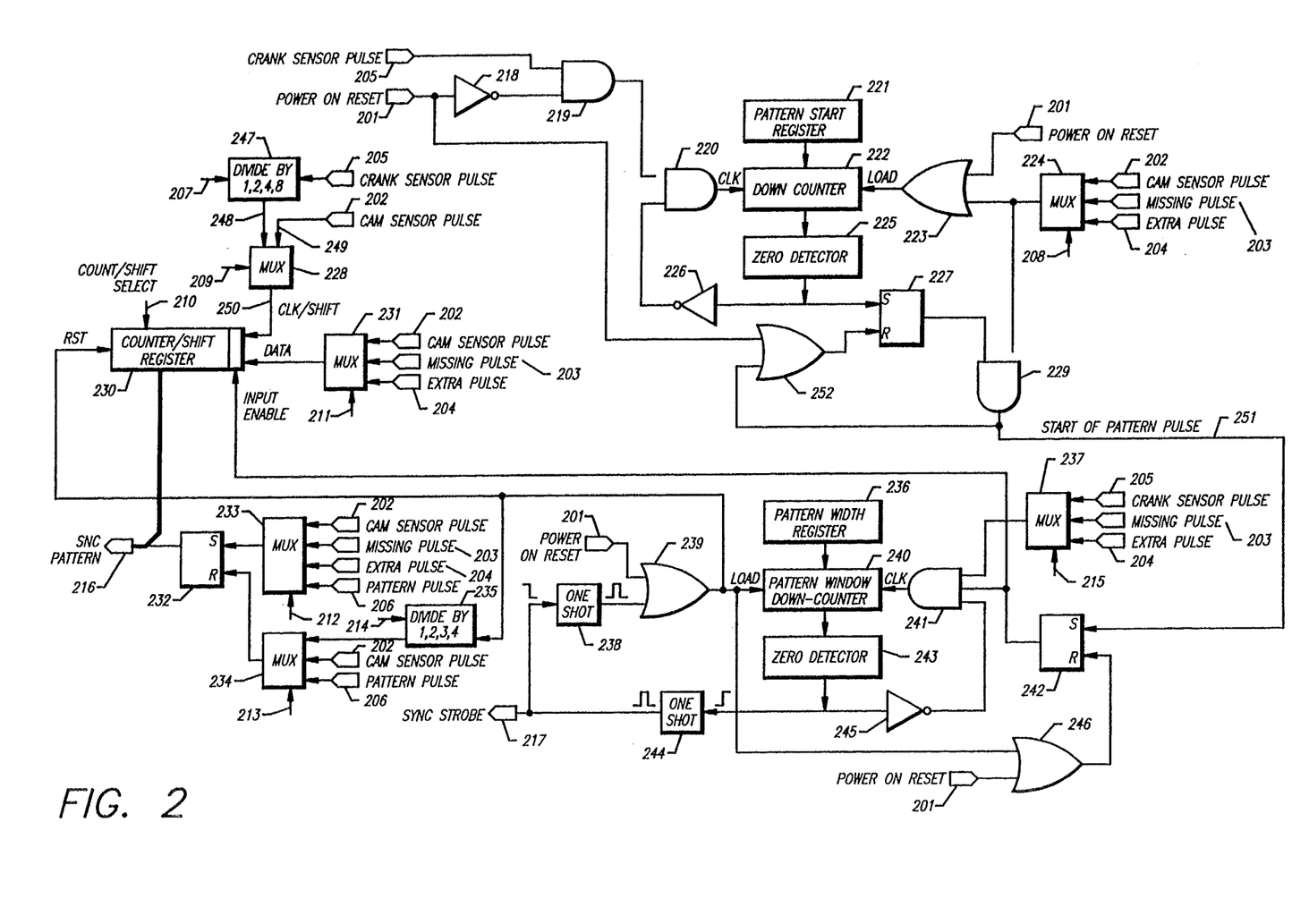
FIG. 2 is a detailed schematic diagram of the start-up enable, pattern window counter and pattern acquisition circuitry of the present invention.

In FIG. 2, the start-up enable circuitry 101, the pattern window counter circuitry 102 and the pattern acquisition circuitry 103 of FIG. 1 are illustrated in detail. The start-up enable circuitry 101 is comprised of multiplexer 224, pattern start register 221, down counter 222, zero detector 225, RS flip-flop 227, inverters 218 and 226, OR gates 223 and 252, AND gates 219, 220, and 229. The pattern window counter circuitry 102 is comprised of multiplexer 237, pattern width register 236, pattern window down counter 240, zero detector 243, RS flip-flop 242, negative-edge triggered one shot 238, positive-edge triggered one shot 244, inverter 245, OR gates 239 and 246, and AND gate 241. Pattern acquisition circuitry 103 is comprised of multiplexers 228, 231, 233, and 234, dividers 235 and 247, counter/shift register 230, and RS flip-flop 232. Divider 235 selectably divides by 1, 2, 3, or 4. Divider 247 selectably divides by 1, 2, 4, or 8.

The crank sensor pulse input signal 205 is coupled to the input of AND gate 219, an input of multiplexer 237 and the clock input of divider 247. The power on reset input signal 201 is coupled to the input of inverter 218, an input of OR gate 252, an input of OR gate 223, an input of OR gate 246, and an input of OR gate 239. The cam sensor pulse input signal 202 is coupled to the "Clk" input 249 of multiplexer 228 and an input of multiplexers 224, 231, 233, and 234. The missing pulse input signal 203 is coupled to an input of multiplexers 224, 231, 233, and 237. The extra pulse input signal 204 is coupled to an input of multiplexers 224, 231, 233, and 237.

Signal 207 is coupled to the select input 207 of divider 247. Signal 208 is coupled to the select input of multiplexer 224. Signal 209 is coupled to the select input of multiplexer 228. Signal 210 is coupled to the count/shift select input of counter/shift register 230. Signal 211 is coupled to the select input of multiplexer 231. Signal 212 is coupled to the select input of multiplexer 233. Signal 213 is coupled to the select input of multiplexer 234. Signal 215 is coupled to the select input of multiplexer 237. Signal 214 is coupled to the select input of divider 235.

The output of inverter 218 is coupled to an input of AND gate 219. The output of AND gate 219 is coupled to an input of AND gate 220. The output of multiplexer 224 is coupled to an input of OR gate 223 and an input of AND gate 229.

The data output of pattern start register 221 is coupled to the data input of down counter 222. The output of down counter 222 is coupled to the input of zero detector 225. The output of zero detector 225 is coupled to the set input of RS flip-flop 227 and the input of inverter 226. The output of inverter 226 is coupled to an input of AND gate 220. The output of AND gate 220 is coupled to the clock input of down counter 222. The output of OR gate 223 is coupled to the load input of down counter 222. The output of RS flip-flop 227 is coupled to an input of AND gate 229. The output of AND gate 229 is coupled to start of pattern pulse signal line 251. Start of pattern pulse signal line 251 is coupled to an input of OR gate 252 and the set input of RS flip-flop 242. The output of OR gate 252 is coupled to the reset input of RS flip-flop 227.

The data output of pattern width register 236 is coupled to the data input of pattern window down counter 240. The data output of pattern window down counter 240 is coupled to the input of zero detector 243. The output of zero detector 243 is coupled to the input of inverter 245 and the input of one shot 244.

The output of multiplexer 237 is coupled to an input of AND gate 241. The output of inverter 245 is coupled to an input of AND gate 241. The output of one shot 244 is coupled to the sync strobe signal 217 and the input of one shot 238. The output of one shot 238 is coupled to an input of OR gate 239. The output of OR gate 239 is coupled to the load input of pattern window down counter 240, an input of OR gate 246, the clock input of divider 235 and the reset input of counter/shift register 230.

The output of OR gate 246 is coupled to the reset input of RS flip-flop 242. The output of RS flip-flop 242 is coupled to an input of AND gate 241 and the input enable input of count/shift register 230. The output of AND gate 241 is coupled to the clock input of pattern window down counter 240.

The pattern signal 206 is coupled to an input of multiplexer 234. The output of divider 235 is coupled to an input of multiplexer 234. The output of multiplexer 234 is coupled to the reset input of RS flip-flop 232. The output of multiplexer 233 is coupled to the set input of RS flip-flop 232. The output of RS flip-flop 232 is coupled to one signal line of sync pattern signal line 216.

The output of divider 247 is coupled to the "shift" input 248 of multiplexer 228. The output of multiplexer 228 is coupled to the clk/shift input 250 of counter/shift register 230. The output of multiplexer 231 is coupled to the data input of counter/shift register 230. The data output of counter/shift register 230 is coupled to all but one line of the sync pattern signal line 216.

The circuitry of FIG. 2 delineates and acquires sensor pulse patterns from an input sensor pulse waveform. The circuit programmably utilizes sensory input from different rotor and sensor configurations. A variety of input sensor pulse waveforms can be accessed through the multiplexers. Parameter values, stored in registers, can be modified to accommodate different pulse patterns. Different functions of the circuit can be enabled by selectably manipulating the multiplexers, the dividers, and other operating signals. Further, the format of the sync pattern signal 216 can be selectively modified for particular applications.

In a typical application, a rotating shaft is coupled to at least one rotor. Rotors may have uniform or non-uniform mark spacing. The rotation of each rotor is monitored by at least one sensor. Each sensor produces a pulse output signal. Pulses in an output waveform signal correspond to the marks on a rotor passing through the sensor's sensing field. As the rotor coupled to the shaft rotates, the sensor detects the presence or absence of marks and produces a corresponding pulse signal.

The crank sensor pulse signal 205 corresponds to the rotation of the crank shaft. The cam sensor pulse signal 202 corresponds to the rotation of the cam shaft. Sensor pulse patterns are demarcated by a "start of pattern" (SOP) signal. This SOP signal is usually a cam sensor pulse signal, a missing pulse signal, or an extra pulse signal.

Missing pulse signal 203 pulses when a "long" interval is detected between successive sensor pulses, corresponding to a missing tooth on the rotor. Often, rotors are designed with a tooth "missing" to provide a detectable synchronization point. The "long" interval between successive pulses is usually longer than that which could be attributed to deceleration by the rotor. Deceleration of the rotor corresponds to deceleration of the shaft. Thus, a "missing tooth" is usually distinguishable from a tooth which is late due to deceleration.

The extra pulse signal 204 pulses when an "extra" pulse is detected in a sensor signal, corresponding to an "extra" tooth on the rotor. The intervals before and after an "extra" pulse are usually shorter than that which could be attributed to acceleration of the rotor. Acceleration of the rotor corresponds to acceleration of the shaft. Thus, an "extra tooth" is usually distinguishable from a tooth which is "early" due to acceleration.

Upon power up, the power on reset signal 201 pulses. The power on reset signal 201 pulse resets counter/shift register 230, RS flip-flop 227 and RS flip-flop 242. Reset RS flip-flop 227 disables AND gate 229. Reset RS flip-flop 242 disables the clock input of the pattern window down counter 240 and the input enable input of counter/shift register 230. For the duration of the reset pulse, the clock input of down counter 222 is disabled while the load inputs of the down counter 222 and the pattern window down counter 240 are enabled.

Select signal 208 causes multiplexer 224 to pass one of the signals at its inputs through to its output. A power on reset signal 201 pulse or a signal from multiplexer 224 enables the down counter 222 to load an initial value from the pattern start register 221. The value held by the pattern start register 221 is usually the number of crank sensor pulse signal 205 pulses that need to be counted in order to insure that the next SOP pulse is valid.

After the power on reset signal 201 returns to a low level, the crank sensor pulse signal 205 clocks down counter 222 to a zero value. If the down counter 222 reaches a zero value prior to a SOP pulse, the next SOP pulse is a valid indication of the beginning of a pulse pattern. If the down counter 222 does not reach zero prior to a SOP pulse, the SOP pulse is invalid. An invalid SOP pulse triggers the load input of down counter 222, causing it to load a value from the pattern start register 221. Thus, a "false" start-up, due to initial positioning in the middle of a pattern, is avoided.

In the case where the down counter 222 reaches zero, the zero detector 225 outputs a pulse which sets RS flip-flop 227 and is inverted by inverter 226. The inverted pulse output by inverter 226 temporarily disables the clock input to down counter 222. The down counter 222 holds the zero value for the duration of the pulse.

Once RS flip-flop 227 is set, it outputs a high signal that enables AND gate 229 to pass the signal output by multiplexer 224. A pulse from multiplexer 224 is passed by AND gate 229 to start of pattern pulse signal 251. The start of pattern pulse signal 251 pulse resets flip-flop 227, disabling AND gate 229. Thus, the start-up enable circuitry 101 outputs valid start of pattern (SOP) pulses as the start of pattern pulse signal 251.

On power up, the pattern window down counter 240 loads a nonzero value from pattern width register 236. The pattern width register 236 usually contains a value equal to the number of indicator pulses utilized to mark the end of a pulse pattern. Zero detector 243 outputs a low signal which is inverted by inverter 245. The high signal output by inverter 245 is presented to an input of AND gate 241.

A start of pattern pulse signal 251 pulse sets RS flip-flop 242. RS flip-flop 242 presents a high signal to an input of AND gate 241. AND gate 241 passes the output of multiplexer 237 to the clock input of pattern window down counter 240. When pattern window down counter 240 counts down to zero, zero detector 243 outputs a high signal, causing one shot 244 to trigger. The output of zero detector 243 is inverted by inverter 245. The low signal output by inverter 245 disables AND gate 241. The output of one shot 244 pulses sync strobe signal 217 and the input of one shot 238. The pulse output by one shot 244 is an end of pattern (EOP) signal. The output of one shot 238 pulses the load input of pattern window down counter 240, the reset input of RS flip-flop 242, the reset input of counter/shift register 230, and the input of divider 235.

Through RS flip-flop 242, the start of pattern pulse signal 251 pulse enables the input enable input of counter/shift register 230. Data passes from the multiplexer 231 into the counter/shift register 230. The resetting of RS flip-flop 242 ends the input enable pulse to the counter/shift register 230 and disables the clock input of pattern window down counter 240. A new start of pattern pulse signal 251 pulse sets flip-flop 242, restarting the cycle of pattern window counter 102 operation.

Crank sensor pulse input signal 205 is presented to the input of divider 247. The output of divider 247 is presented to the "shift" input 248 of multiplexer 228. Cam sensor pulse input signal 202 is presented to the "clk" input 249 of multiplexer 228. Multiplexer 228 selects between the "shift" input 248 and the "clk" input 249, and outputs to the clk/shift input 250 of the counter/shift register 230. Count/shift select signal 210 selects the operating mode of the counter/shift register 230. Data entering the counter/shift register 230 is counted or shifted and the corresponding output signal is provided to sync pattern signal line 216. Multiplexers 233 and 234, along with divider 235, allow a variety of programming to customize one signal line of sync pattern signal line 216 for particular applications.

Figure 3:
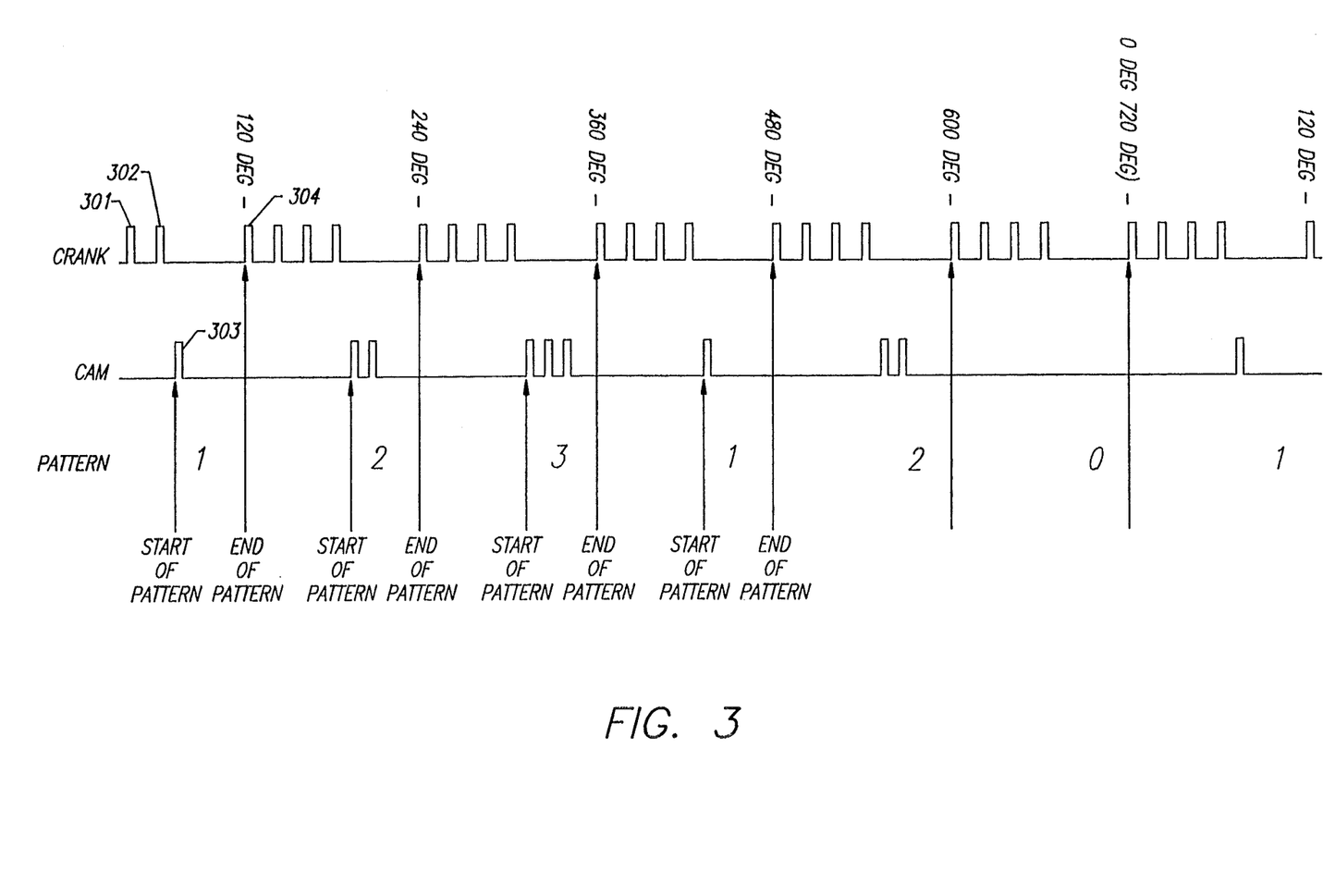
FIG. 3 illustrates a sample input signal diagram.
Figure 4A:
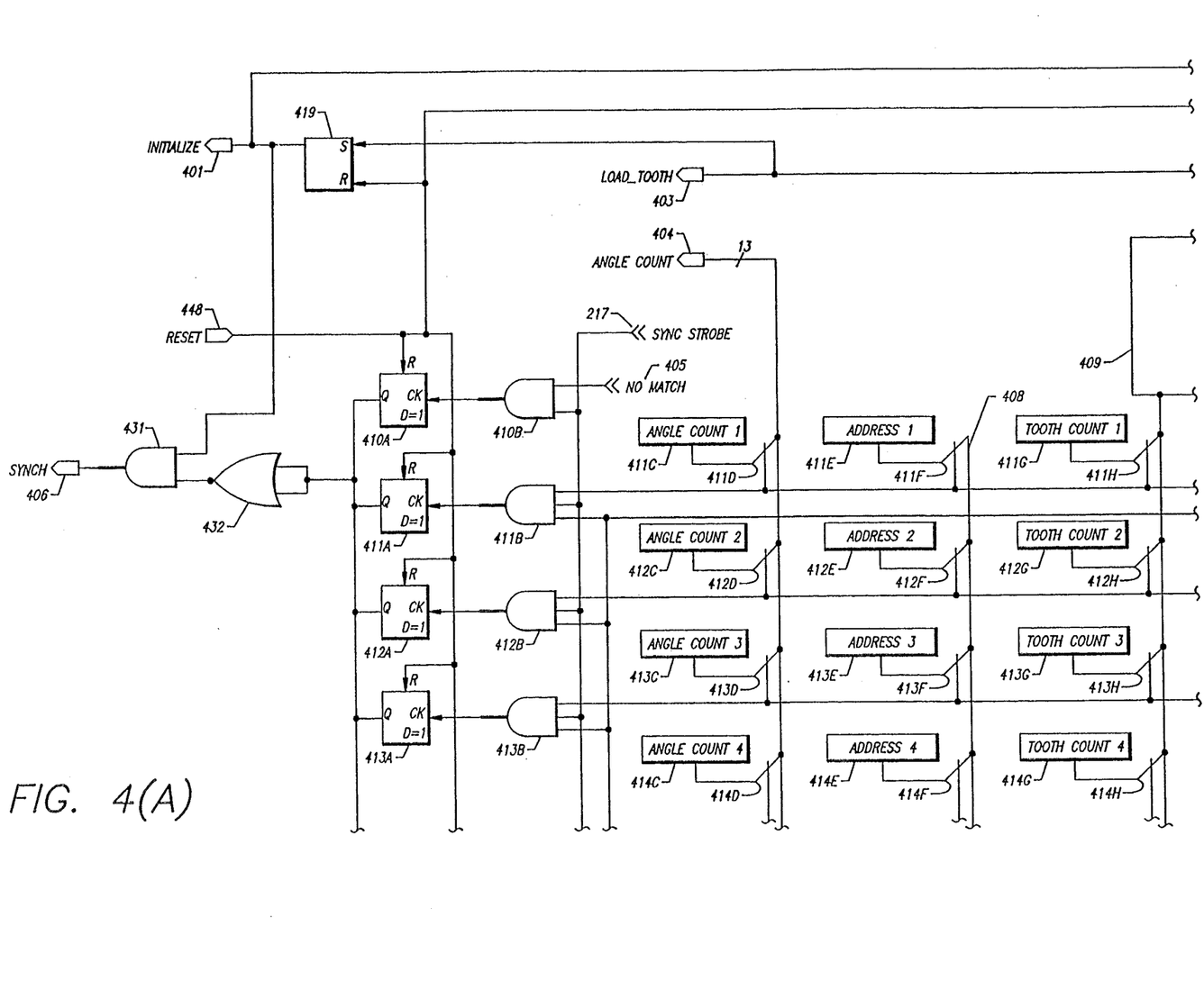
FIG. 4 is a detailed schematic diagram of the pattern matching circuitry of the present invention.
Figure 4B:
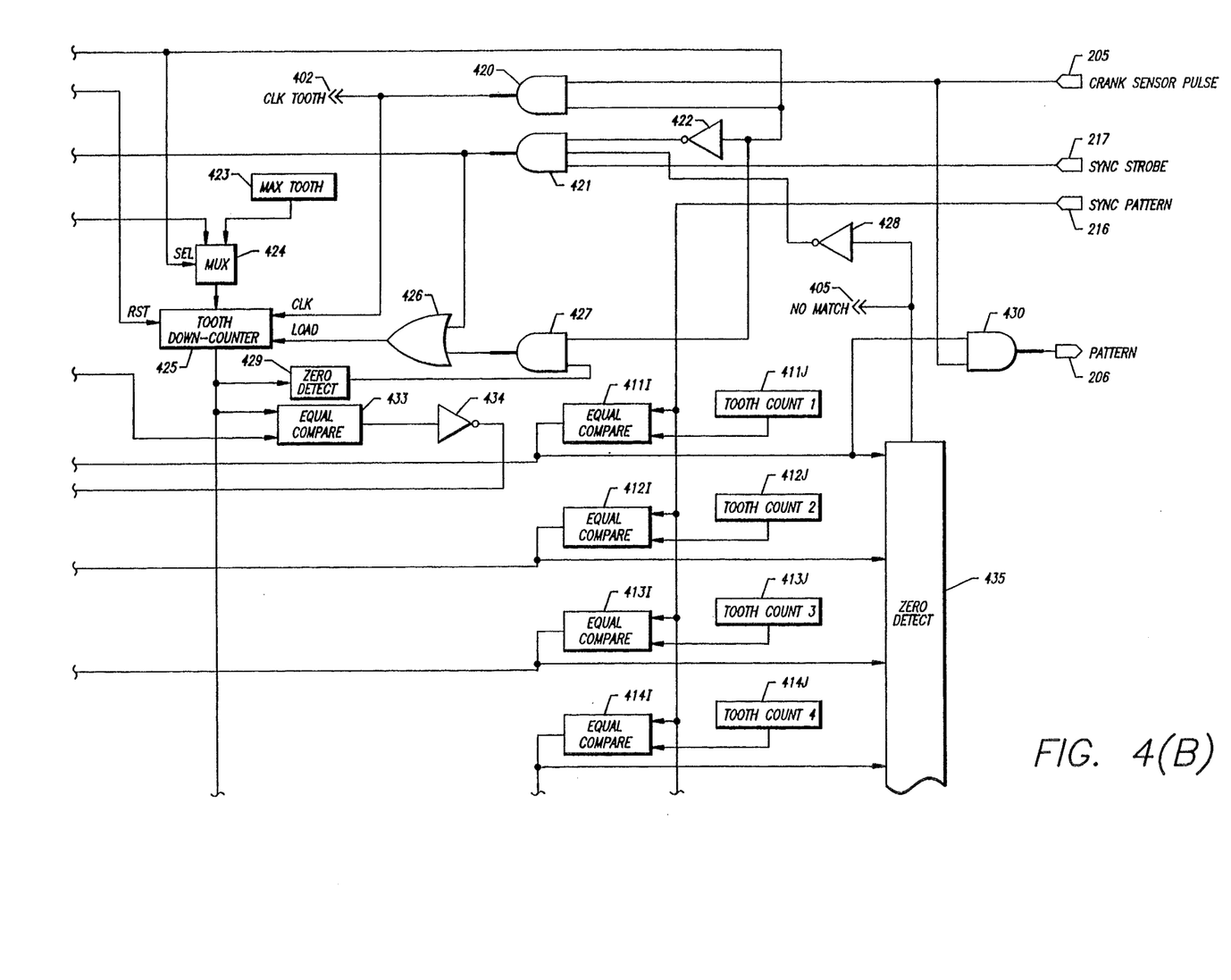
Figure 4C:
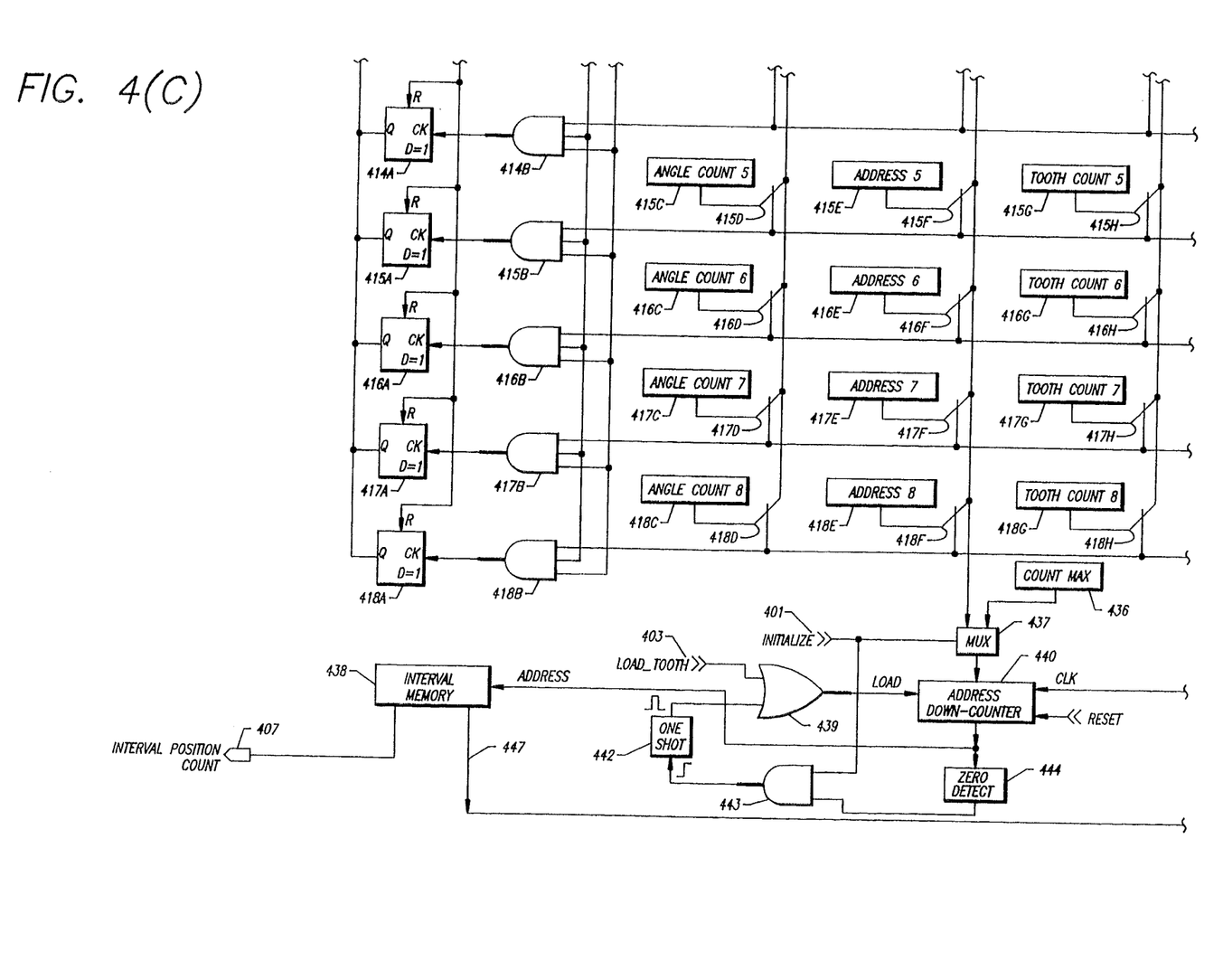
Figure 4D:
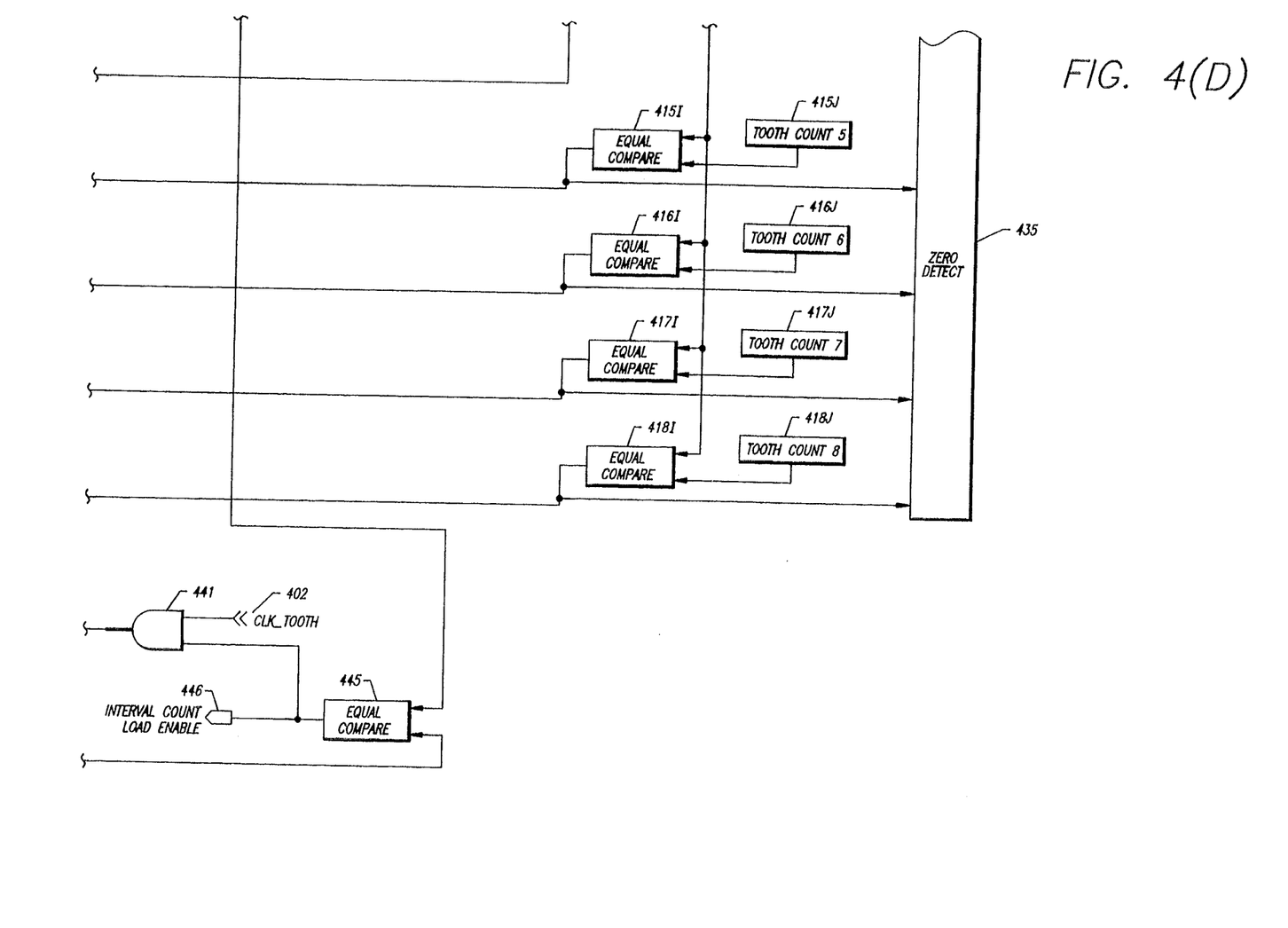

Referring to FIGS. 2 and 3, the operation of the present invention is described in the following example. FIG. 3 illustrates typical electronic sensor pulse patterns corresponding to the patterns of marks on a crankshaft rotor and a camshaft rotor. The crank and cam pulse signal patterns of FIG. 3 can be presented to the circuitry of FIG. 2 as the crank sensor pulse signal 205 and the cam sensor pulse signal 202, respectively.

To provide a concise example of the operation of the present invention, the following parameter assumptions are necessary. Select signal 208 is driven by circuitry such that the output of multiplexer 224 is equivalent to the ORing of the cam sensor pulse signal 202 and the missing pulse signal 203. Select signal 215 is set so that multiplexer 237 passes crank sensor pulse signal 205 to an input of AND gate 241. Counter/shift register 230 is reset to count. Select signal 209 is set so that multiplexer 228 selects cam sensor pulse signal 202 to clock the counter/shift register 230. Select signal 211 is set so that multiplexer 231 passes cam sensor pulse signal 202 to the data input of counter/shift register 230. The output of RS flip-flop 232 to a single line of sync pattern signal line 216 is ignored for the purposes of this example.

For this example, pattern start register 221 contains the value 1. If two consecutive pulses on crank sensor pulse signal 205 are detected, without a pulse on cam sensor pulse signal 202 or missing pulse signal 203 being detected, the next pulse on cam sensor pulse signal 202 or missing pulse signal 203 is a valid start of pattern (SOP) indication. Pattern width register 236 contains the value 1. Once a pulse on crank sensor pulse signal 205 clocks pattern width down counter 240, an end of pattern (EOP) signal is triggered.

Referring to pattern I in FIG. 3, down counter 222 counts the two crank pulses 301 and 302, counting down from 1 to 0. Zero detector 225 sets RS flip-flop 227 and temporarily disables AND gate 220. The first cam pulse 303 is a valid start of pattern (SOP) indication.

The pulse on start of pattern pulse signal 251 resets RS flip-flop 227 and sets RS flip-flop 242, enabling the crank sensor pulse signal 205 to clock the pattern window down counter 240 and enabling the input enable of counter/shift register 230. The cam sensor pulse signal 202 is effectively coupled to the clock and data inputs of the counter/shift register 230. Counter/shift register 230 counts the single cam pulse 303 and outputs the count on sync pattern signal line 216.

Still referring to pattern 1 in FIG. 3, the pattern window down counter 240 counts the next crank pulse 304, counting down from 1 to 0. The output of zero detector 243 triggers one shot 244. One shot 244 pulses sync strobe signal 217 and one shot 238. After the delay introduced by one shot 244, one shot 238 pulses, resetting the counter/shift register 230, pulsing the load input of pattern window down counter 240, and resetting RS flip-flop 242. Thus, the pattern window down counter 240 is prepared to count the next end of pattern indicator pulse and the counter/shift register 230 is prepared to acquire the next pattern of cam pulses once a new start of pattern pulse signal pulse 251 occurs.

FIG. 4 illustrates the pattern matching and synchronization circuitry 104 of the present invention. The pattern matching and synchronization circuitry is comprised of tooth down counter 425; address down counter 440; interval memory 438; zero detectors 429, 435, and 444; memory blocks 423, 411J–418J, 411C–418C, 411E–418E, 411G–418G, and 436; equality comparators 433, 411I–418I, and 445; multiplexers 424 and 437; one shot 442; AND gates 420, 421, 427, 430, 410B–418B, 431, 441, and 443; OR gates 426 and 439; NOR gate 432; inverters 422, 428, and 434; D flip-flops 410A–418A; and RS flip-flop 419.

Interval memory 438 contains interval position count and "tooth of change" information. Memory block 423 contains the maximum number of teeth to be sensed during one full cycle of operation. Memory block 436 contains the highest address utilized in the interval memory 438. Memory blocks 411J–418J contain unique patterns 1-8, respectively. Memory blocks 411C–418C contain angle counts 1-8, respectively. Memory blocks 411E–418E contain addresses 1-8, respectively. Memory blocks 411G–418G contain tooth counts 1-8, respectively. One shot 442 is positive-edge triggered.

Sync strobe signal 217 is coupled to an input of AND gate 430, an input of AND gate 421, and an input of AND gates 410B–418B. Sync pattern signal 216 is coupled to an input of equality comparators 411I–418I. Crank sensor pulse input signal 205 is coupled to an input of AND gate 420. Reset input signal 448 is coupled to the reset input of RS flip-flop 419, the reset input of tooth down counter 425, the reset input of address down counter 440, and the reset inputs of D flip-flops 410A–418A.

The output of equality comparator 411I is coupled to an input of zero detector 435, an input of AND gate 430, an input of AND gate 411B, and the gates of switches 411D, 411F and 411H. The output of AND gate 430 is coupled to the pattern signal 206. The output of equality comparator 412I is coupled of an input of zero detector 435, an input of AND gate 412B, and the gates of switches 412D, 412F, and 412H. The output of equality comparator 413I is coupled to an input of zero detector 435, an input of AND gate 413B, and the gates of switches 413D, 413F, and 413H. The output of equality comparator 414I is coupled to an input of zero detector 435, an input of AND gate 414B, and the gates of switches 414D, 414F, and 414H.

The output of equality comparator 415I is coupled to an input of zero detector 435, an input of AND gate 415B, and the gates of switches 415D, 415F, and 415H. The output of equality comparator 416I is coupled to an input of zero detector 435, an input of AND gate 416B, and the gates of switches 416D, 416F, and 416H. The output of equality comparator 417I is coupled to an input of zero detector 435, an input of AND gate 417B, and the gates of switches 417D, 417F, and 417H. The output of equality comparator 418I is coupled to an input of zero detector 435, an input of AND gate 418B, and the gates of switches 418D, 418F, and 418H.

The outputs of AND gates 410B–418B are coupled to the clock inputs of D flip-flops 410A–418A, respectively. The D inputs of D flip-flops 410A–418A are coupled to high signals. The outputs of D flip-flops 410A–418A are each coupled to an input of multiple input NOR gate 432. The output of NOR gate 432 is coupled to an input of AND gate 431. The output of AND gate 431 is coupled to the sync output signal 406.

The output of zero detector 435 is coupled to the input of inverter 428 and no match signal 405. No match signal 405 is coupled to an input of AND gate 410B. The output of inverter 428 is coupled to an input of AND gate 421. The output of AND gate 421 is coupled to an input of OR gate 426, the load_tooth signal 403, and the set input of RS flip-flop 419. Load_tooth signal 403 is coupled to an input of OR gate 439. The output of RS flip-flop 419 is coupled to initialize signal 401, an input of AND gate 431, the select input of multiplexer 424, an input of AND gate 420, the input of inverter 422, an input of AND gate 427, the select input of multiplexer 437, and an input of AND gate 443. The output of AND gate 420 is coupled to the clock input of tooth down counter 425 and the clk_tooth signal 402.

Memory locations 411J–418J are coupled to an input of equality comparators 411I–418I, respectively. Memory blocks 411C–418C are coupled to the first terminals of switches 411D–418D, respectively. The second terminals of switches 411D–418D are coupled to the angle count output signal 404. Memory blocks 411E–418E are coupled to the first terminals of switches 411F–418F, respectively. The second terminals of switches 411F–418F are coupled to signal line 408. Signal line 408 is coupled to a data input of multiplexer 437. Memory blocks 411G–418G are coupled to the first terminals of switches 411H–418H, respectively. The second terminals of switches 411H–418H are coupled to signal line 409. Signal line 409 is coupled to an input of equality comparator 433 and a data input of multiplexer 424.

The output of memory block 423 is coupled to a data input of multiplexer 424. The output of multiplexer 424 is connected to the data input of tooth down counter 425. The output of tooth down counter 425 is coupled to the input of zero detector 429, the input of equality comparator 433 and the input of equality comparator 445. The output of zero detector 429 is coupled to an input of AND gate 427. The output of AND gate 427 is coupled to an input of OR gate 426. The output of OR gate 426 is coupled to the load input of tooth down counter 425. The output of equality comparator 433 is coupled to the input of inverter 434. The output of inverter 434 is coupled to an input of AND gates 411B–418B.

The output of memory location 436 is coupled to a data input of multiplexer 437. The output of multiplexer 437 is coupled to the data input of address down counter 440. The clk_tooth signal 402 is coupled to an input of AND gate 441. The output of AND gate 441 is coupled to the clock input of address down counter 440.

The output of address down counter 440 is coupled to the input of zero detector 444 and the address input of interval memory 438. The output of zero detector 444 is coupled to an input of AND gate 443. The output of AND gate 443 is coupled to an input of one shot 442. The output of one shot 442 is coupled to an input of OR gate 439.

One output of interval memory 438 is coupled to the interval position count output signal 407. The interval position count output signal 407 indicates the angular displacement between rotor teeth. The other output of interval memory 438 is coupled to signal line 447. Signal line 447 is coupled to an input of equality comparator 445. The signal line 447 indicates the teeth at which the angular displacement between rotor teeth change. The output of equality comparator 445 is coupled to an input of AND gate 441 and the interval count load enable output signal 446.

A pulse on reset signal 448 resets RS flip-flop 419 and D flip-flops 410A–418A, causing each to output a low signal. NOR gate 432 presents a high signal to an input of AND gate 431. RS flip-flop 419 outputs a low signal on initialize signal 401, disabling AND gate 431. Thus, AND gate 431 outputs a low signal as the sync output signal 406. The pulse on reset signal 448 also resets tooth down counter 425 and address down counter 440 to a zero value.

The zero address in address down counter 440 accesses a memory block in interval memory 438. Interval memory 438 outputs information regarding the angular spacing between teeth on interval position count output signal 407. Interval memory 438 outputs a value on signal line 447 indicating the next tooth after which the interval between teeth changes. Equality comparator 445 compares the zero value output of tooth down counter 425 with the value on signal line 447. When the two values are equal, the equality comparator outputs a high signal on interval count load enable output signal 446, enabling AND gate 441.

The low signal on initialize signal 401 disables AND gate 420, resulting in a low clk_tooth signal 402. The initialize signal 401 is inverted by inverter 422 and the inverted signal applied to an input of AND gate 421. The low signal on initialize signal 401 disables AND gate 427 and AND gate 443. Further, the low signal on initialize signal 401 causes multiplexer 424 to select signal line 409 and causes multiplexer 437 to select signal line 408.

Initially, both sync strobe signal 217 and sync pattern signal 216 are low signals. The low signal on sync strobe signal 217 disables AND gate 421, providing a low signal as load_tooth signal 403 to an input of OR gates 426 and 439. The low signal on sync strobe signal 217 also disables AND gate 430, causing it to output a low signal as pattern signal 206. While the sync strobe signal 217 is low, the signals produced by equality comparators 411I–418I are of no consequence. A low signal on sync strobe signal 217 disables AND gates 410B–418B, preventing the clocking of D flip-flops 410A–418A. The angular position indicator 105 (not shown in detail), which utilizes angle count signal 404, can be partially disabled by a low sync strobe signal 217. This could be implemented by ANDing the angle count signal 404 and the sync strobe signal 217. Similarly, neither the tooth down counter 425 nor the address down counter 440 can clock while the sync strobe signal 217 is a low signal.

In a typical application, pattern acquisition circuitry 103 provides a sensor pulse pattern on sync pattern signal 216 and marks the end of the pattern by pulsing the sync strobe signal 217. The pattern from sync pattern signal 216 is compared to patterns 1–8 by equality comparators 411I–418I, respectively. A valid sync pattern signal 216 pattern matches exactly one of the patterns 1–8. Equality comparators 411I–418I output a high signal if the two patterns at their respective inputs are identical and a low signal otherwise.

If no matching pattern is found, each of equality comparators 411I–418I outputs a low signal, deactivating switches 411D–418D, 411F–418F, and 411H–418H, and disabling AND gates 411B–418B. Zero detector 435 outputs a high signal on no match signal line 405, which is inverted by inverter 428 and disables AND gate 421. The low signal output by equality comparator 411I disables AND gate 430. The high signal on no match signal line 405 enables AND gate 410B to clock D flip-flop 410A with sync strobe signal 217. The high signal provided by D flip-flop 410A is inverted by NOR gate 432, thus disabling AND gate 431. The sync output signal 406 remains low until the reset input signal 448 is pulsed.

If the sync pattern signal 216 pattern matches one of patterns 1–8, one of equality comparators 411I–418I outputs a high signal to one input of the corresponding AND gate 411B–418B. Zero detector 435 outputs a low signal on no match signal line 405, disabling AND gate 410B. The low signal output by zero detector 435 is inverted by inverter 428, presenting a high signal to an input of AND gate 421. If the sync pattern signal 216 pattern matches with pattern 1, the high signal output by equality comparator 411I enables sync strobe signal 217 to pulse AND gate 430 and thus pulse pattern signal 206.

The high signal output by equality comparator 41xI (where x is a number from 1 to 8) activates the corresponding switches 41xD, 41xF and 41xH. Switch 41xD provides the contents of memory block 41xC to angle count output signal 404. In a typical application, the angle count output signal 404 is utilized by the angle position counter of an angular position indicator indicator 105. Switch 41xF provides the contents of memory block 41xE to signal line 408. Switch 41xH provides the contents of memory block 41xG to signal line 409. As an example, when the sync pattern signal 216 pattern matches pattern 1, equality comparator 411I activates switches 411D, 411F, and 411H. Switch 411D provides angle count 1 to angle count output signal 404. Switch 411F provides address I to signal line 408. Switch 411H provides tooth count 1 to signal line 409.

When the first pattern from sync pattern signal 216 matches, two of the three inputs of AND gate 421 are high. A sync strobe signal 217 pulse provides the third high signal to the input of AND gate 421. AND gate 421 outputs a high signal on load_tooth signal line 403, setting RS flip-flop 419 and enabling the load inputs of both the tooth down counter 425 and the address down counter 440. The tooth down counter 425 loads the current tooth value from signal line 409. The address down counter 440 loads the appropriate address from signal line 408. The angle count output signal 404 provides the correct angle count corresponding to the present angular position of the rotor. The tooth value loaded into the tooth down counter 425 corresponds to the first tooth that occurs after the matched pattern. Thus, the tooth down counter 425 and the shaft are synchronized.

Setting RS flip-flop 419 causes it to output a high signal on the initialize signal line 401. A high signal on the initialize signal line 401 enables AND gate 431 to pass the output of NOR gate 432 to the synch output signal 406. The outputs of D flip-flops 410A–418A are low signals because none of these flip-flops have been clocked. NOR gate 432 presents a high signal to the sync output signal 406. The rising edge of sync output signal 406 indicates that synchronization has been achieved. An angular position indicator 105, can monitor the synch output signal 406 to determine when other synchronization signals are valid.

The high signal on initialize signal 401 causes multiplexer 424 to select the memory block 423, causes multiplexer 437 to select memory block 436, enables AND gate 427 to pass the output of zero detector 429 to the input of OR gate 426, and enables AND gate 443 to pass the output of zero detector 444 to the input of one shot 442. The high signal on initialize signal 401 is inverted by inverter 422. Inverter 422 presents a low signal to an input of AND gate 421, terminating this load_tooth signal 403 pulse. The high signal on initialize signal 401 enables AND gate 420 to pass the crank sensor pulse input signal 205 to the clk_tooth signal 402.

The tooth down counter 425 tracks engine position by counting crank sensor pulse 205 pulses. When tooth down counter reaches zero, zero detector 429 applies a high signal to an input of AND gate 427. The other input of AND gate 427, initialize signal 401, is also high, enabling the load input of tooth down counter 425.

When initialize signal 401 is high, multiplexer 424 selects the value held by memory block 423 to load into the tooth down counter 425. A nonzero value in the tooth down counter 425, causes zero detector 429 to terminate this load pulse.

The address down counter 440 is initially loaded with an address from memory blocks 411E–418E, corresponding to the particular pattern first matched. Interval memory 438 stores the interval (in terms of angular position counts) between pairs of successive teeth and the tooth on which the interval between teeth changes. The interval position count signal 407 is used by an angular position indicator to provide a fixed number of angle position counts between pairs of sensor pulses.

The address down counter 440 presents an address to the interval memory 438, accessing memory containing corresponding tooth of change and interval values. The interval is output as interval position count output signal 407. The tooth of change is output on line 447 and presented to the equality comparator 445. The equality comparator 445 compares the current value in the tooth down counter 425 and the tooth of change on line 447. If both refer to the same tooth, then a high signal is output by equality comparator 445 as interval count load enable output signal 446, enabling AND gate 441 to pass clk_tooth signal 402. Clk_tooth signal 402 clocks address down counter 440. The address down counter 440 clocks down one address, presenting that address to the interval memory 438, which begins the cycle anew.

This address down counting process continues until the zero address is reached. Zero detector 444 detects a zero address and triggers one shot 442. One shot 442 creates a pulse that passes through OR gate 439 and strobes the load input of address down counter 440. Address down counter 440 loads the value held by memory block 436.

Initialize signal 401 remains a high signal, load_tooth signal 403 remains a low signal, and clk_tooth signal 402 remains coupled to crank sensor pulse input signal 205 until RS flip-flop 419 is reset by a reset signal 448 pulse.

Once synchronization has been achieved, patterns from the sync pattern signal 216 continue to be matched with the stored patterns 411J–418J. When a particular sync pattern is matched, the corresponding value located in memory block 411G–418G is compared with the current value stored in the tooth down counter 425 by the equality comparator 433. If the tooth counts are equal, then synchronization has been maintained and equality comparator 433 outputs a high signal. If the tooth counts are unequal, the position indicated by the pattern is not the same as that indicated by the tooth down counter 425. Synchronization has been lost and equality comparator 433 outputs a low signal.

When synchronization is lost, the low signal output by equality comparator 433 is inverted by inverter 434. The high signal output by inverter 434 is presented to an input of AND gates 411B–418B. One of equality comparators 411I–418I outputs a high signal to an input of AND gates 411B–418B. The sync strobe signal 217 pulses the third input of AND gates 411B–418B. Thus, one of AND gates 411B–418B outputs a high signal, clocking the corresponding D flip-flop 410A–418A. In response, NOR gate 432 provides a low signal to disable AND gate 431. The sync signal 406 falls to a low signal. The falling edge of sync signal 406 indicates that synchronization is lost.

We claim:

1. A programmable synchronization circuit comprising:
   start-up enable means coupled to a first plurality of pulse signals, said start-up enable means determining a beginning of a pulse pattern on one of said first plurality of pulse signals, said pulse pattern representing uniform and non-uniform patterns of mark spacings of a rotor;
   pattern window counting means coupled to said start-up enable means, said pattern window counting means determining an end of said pulse pattern;
   pattern acquisition means coupled to said pattern window counting means, said pattern acquisition means acquiring said pulse pattern and providing a pattern output signal comprising said acquired pulse pattern;
   pattern matching and synchronizing means coupled to said pattern window counting means and said pattern acquisition means, said pattern matching and synchronizing means matching said acquired pulse pattern to one of a plurality of pre-programmed pulse patterns, each of said plurality of preprogrammed pulse patterns representing uniform and non-uniform patterns of mark spacings, and providing a plurality of synchronization signals suitable for use by an angular position indicator.

2. The circuit of claim 1 wherein said start-up enable means comprises:
   pattern start memory means;
   first counting means coupled to said pattern start memory means and said first plurality of pulse signals, said first counting means counting one of said first plurality of pulse signals;
   detection means coupled to said first counting means and said first plurality of pulse signals, said detection means providing a first signal indicating the beginning of said pulse pattern.

3. The circuit of claim 1 wherein said pattern window counting means comprises:
   pattern width memory means;
   first counting means coupled to said pattern width memory means and a second plurality of pulse signals, said first counting means counting one of said first plurality of pulse signals;
   detection means coupled to said first counting means, said detection means providing a first end of pulse pattern signal;
   delay means coupled to said detection means providing a second end of pulse pattern signal after said first end of pulse pattern signal.

4. The circuit of claim 1 wherein said pattern acquisition means comprises:
   pulse receiving means coupled to a second plurality of pulse signals, said pulse receiving means acquiring said pulse pattern and providing said pattern output signal comprising said acquired pulse pattern.

5. The circuit of claim 1 wherein said pattern matching and synchronizing means comprises:
   pattern storage means containing at least one stored pattern;
   a first comparator coupled to said pattern storage means, said first comparator comparing a pattern signal with said at least one stored pattern and providing a binary output for each comparison;
   memory means coupled to said first comparator, said memory means providing said plurality of synchronization signals;
   counting means docked by said first plurality of pulse signals, said counting means loaded with an expected count;
   a second comparator coupled to said counting means, said second comparator comparing said expected count with a pulse count from said plurality of synchronization signals, a match between said expected count and said pulse count indicating synchronization.

6. A programmable synchronization circuit comprising:
   start-up enable means coupled to a first plurality of pulse signals, said start-up enable means determining a beginning of a pulse pattern on one of said first plurality of pulse signals and providing a first output signal indicating start of a pattern, said pulse pattern representing uniform and non-uniform patterns of mark spacings of a rotor;
   pattern window counting means coupled to said start-up enable means and to said first plurality of pulse signals, said pattern window counting means receiving said first output signal and providing an end of a pattern signal;
   pattern acquisition means coupled to said pattern window counting means and said first plurality of pulse signals, said pattern acquisition means acquiring said pulse pattern and providing a pattern output signal comprising said acquired pulse pattern;
   pattern matching and synchronizing means coupled to said pattern window counting means and said pattern acquisition means, said pattern matching and synchronizing means matching said acquired pulse pattern to one of a plurality of pre-programmed pulse patterns, each of said plurality of pre-programmed pulse patterns representing uniform and non-uniform patterns of mark spacings, and providing a plurality of synchronization signals suitable for use by an angular position indicator.

7. The circuit of claim 6 wherein said start-up enable means comprises:
   pattern start memory means;
   first counting means coupled to said pattern start memory means and said first plurality of pulse signals, said first counting means counting one of said first plurality of pulse signals;
   detection means coupled to said first counting means and said first plurality of pulse signals, said detection means providing a beginning of said pattern signal.

8. The circuit of claim 6 wherein said pattern window counting means comprises:
   pattern width memory means;
   first counting means coupled to said pattern width memory means and a second plurality of pulse signals, said first counting means counting one of said first plurality of pulse signals, said first counting means clocked by one of said second plurality of pulse signals;
   detection means coupled to said first counting means, said detection means providing a first end of said pattern signal;
   delay means coupled to said detection means providing a second end of said pattern signal after said first end of said pattern signal.

9. The circuit of claim 6 wherein said pattern acquisition means comprises:
pulse receiving means coupled to said first plurality of pulse signals and a pattern pulse signal, said pulse receiving means acquiring said pulse pattern and providing said pattern output signal comprising said acquired pulse pattern.

10. The circuit of claim 6 wherein said pattern matching and synchronization means comprises:
pattern storage means containing at least one stored pattern;
a first comparator coupled to said pattern storage means, said first comparator comparing said pattern signal with said at least one stored pattern and providing a binary output for each comparison;
memory means coupled to said first comparator, said memory means providing said plurality of synchronization signals;
first counting means clocked by one of said second plurality of pulse signals, said first counting means loaded with an expected count in response to said end of said pattern signal;
a second comparator coupled to said first counting means, said second comparator comparing said expected count with a pulse count from said plurality of synchronization signals, a match between said expected count and said pulse count indicating synchronization between said acquired pulse pattern and said pre-programmed pattern.

11. A circuit for pattern matching and synchronization comprising:
pattern storage means containing at least one stored pattern of rotor markings, said at least one stored pattern of rotor markings representing uniform and non-uniform patterns of mark spacings of a rotor;
a first comparator coupled to said pattern storage means and receiving a pattern signal, said first comparator comparing said pattern signal with said at least one stored pattern of rotor markings and providing a binary output for each comparison;
memory means coupled to said first comparator, said memory means providing a plurality of synchronization signals;
counting means clocked by a plurality of pulse signals, said counting means loaded with an expected count;
a second comparator coupled to said counting means, said second comparator comparing said expected count with a pulse count from said plurality of synchronization signals, a match between said expected count and said pulse count indicating synchronization.

* * * * *